United States Patent [19]
Clarke

[11] Patent Number: 4,583,107
[45] Date of Patent: Apr. 15, 1986

[54] CASTELLATED GATE FIELD EFFECT TRANSISTOR

[75] Inventor: Rowland C. Clarke, Penn Hills, Pa.

[73] Assignee: Westinghouse Electric Corp., Pittsburgh, Pa.

[21] Appl. No.: 523,819

[22] Filed: Aug. 15, 1983

[51] Int. Cl.$^4$ ............... H01L 29/80; H01L 29/48; H01L 29/06; H01L 29/36

[52] U.S. Cl. .................. 357/22; 357/58; 357/15; 357/20; 357/55

[58] Field of Search ............ 357/22, 58, 15, 41, 357/20

[56] References Cited

U.S. PATENT DOCUMENTS

| | | | |
|---|---|---|---|
| 3,663,873 | 5/1972 | Yagi | 357/89 |
| 3,701,198 | 10/1972 | Glinski | 357/22 |
| 4,104,672 | 8/1978 | DiLorenzo et al. | 357/22 |
| 4,327,475 | 5/1982 | Asai et al. | 357/22 |
| 4,393,391 | 7/1983 | Blanchard | 357/23 |
| 4,463,366 | 7/1984 | Ishii et al. | 357/22 |
| 4,482,907 | 11/1984 | Jay | 357/22 |

FOREIGN PATENT DOCUMENTS

| | | | |
|---|---|---|---|
| 2728532 | 1/1979 | Fed. Rep. of Germany | 357/22.5 |
| 56-100482 | 8/1981 | Japan | 357/22.5 |

OTHER PUBLICATIONS

DiLorenzo, J. V. and Wisseman, W. R., "GaAs Power MESFET's Design Fabrication and Performance," (1979), IEEE Trans. M.T.T. 27, No. 5, pp. 367-378.

Wemple, S. H., Niehaus, W. C., Schlosser, W. O., DiLorenzo, J. V. and Cox, H. M., "Performance of GaAs Power MESFETs," (1978), Electron Lett., vol. 14, pp. 175-176.

Macksey, H. M., Adams, R. L., McQuiddy, Jr., D. N., Shaw, D. W., and Wissemann, W. R., "Dependence on GaAs Power MESFET Microwave Performance on Device and Material Parameters," (1977), IEEE Trans. Electron Devices, vol. ED24, p. 113.

Wemple, S. H., Niehaus, W. C., Cox, H. M., DiLorenzo, J. V., and Schlosser, W. O., "Control of Gate to Drain Avalanche in GaAs MESFETs," IEEE Trans. Electron Devices, vol. ED27, No. 6, pp. 1013-1018, Jun. 1980.

Tiwari, W., Eastman, L. F., and Rathburn, L., "Physical and Material Limitations on Burnout Voltage of GaAs Power MESFETs," (1980), IEEE Trans. Electron Devices, vol. ED27, No. 6, pp. 1045-1054, Jun. 1980.

Furutsuka, T., Tsuji, T., and Hasegawa, F. (1978), IEEE Trans. Electron Devices V 25 h6, Jun. 1978, pp. 563-567.

Fukuta, M., Suyama, K., Suzuki, Y., Nakayama, Y., and Ishikawa, H., "Power GaAs MESFET with a High Drain Source Breakdown Voltage," IEEE Trans. M.T.T., vol. MTT-24, No. 6, pp. 312-317, Jun. 1976.

Ladbrooke, P. H., and Martin, A. L., "Material and Structure Factors Affecting the Large Signal Operation of GaAs MESFETs," Int. Conf. on Semi-Insulating GaAs, France, pp. 313-320, 1980.

Engelmann, R. W. H. and Liechti, C. A. (1977) IEEE Trans. Electron Devices, '77 Nov., pp. 1288-1296.

Morizane, K., Dosen, M., Mori, Y., "A Mechanism of Source-Drain Burnout in GaAs MESFETs," (1979), Inst. Phys. Conf., Ser. No. 45: pp. 287-294

(List continued on next page.)

Primary Examiner—William D. Larkins
Assistant Examiner—John Lamont
Attorney, Agent, or Firm—W. G. Sutcliff

[57] ABSTRACT

A field effect transistor is described incorporating a semiconductor layer over a layer or substrate of semi-insulating semiconductor material and a gate electrode which periodically passes through the semiconductor layer to the substrate to form a plurality of conducting bars in the semiconductor layer for transistor current and which at pinch-off confines the current interior of each conducting bar. The invention overcomes the problem of leakage current at pinch-off, thus improving the efficiency of the field effect transistor as a power amplifier.

15 Claims, 15 Drawing Figures

OTHER PUBLICATIONS

Hasegawa, F., Takayama, Y., Higashisaka, A., Furutsuka, T., and Honjo, K., "GaAs Power MESFETs with a Simplified Recess Structure," (1978), in ISSCC Techn. Dia., pp. 118, 119.

Fukuta, M., et al. (1976) IEEE Trans. Microwave Theory and Tech., MTT-24:312-317.

D'Asaro, J. V. DiLorenzo and H. Fukuii, "Improved of GaAs Microwave Field Effect Transistors with Via Connections Through the Substrate," (1977) Int. Electron Devices Meeting Tech. Diag., p. 370.

Anderson, J. R., Omori, M. and Cooke, F., (1978) IEEE Int. Electron Devices Meeting Dig. Tech. Papers, p. 133.

Thomas, R. N., Hobgood, H. M., Barrett, D. L. and Eldridge, G. W., "Large-Diameter Undoped Semi-Insulating GaAs for High Mobility Direct Ion-Implanted FET Technology," Proc. Semi-Insulating III-V Materials Conf. (Nottingham, England, Apr. 1980).

Higashisaka, A., Takayama, Y., and Hasegawa, F., "A High-Powered GaAs MESFET with an Experimentally Optimized Pattern," IEEE Trans. Electron Devices, vol. ED-27, No. 6, Jun., 1980, pp. 1025-1029.

Fukuii, H., "Channel Current Limitations in GaAs MESFETs," Solid State Electronics, vol. 22, pp. 507-515, 1979.

Itoh, T. and Yanai, H., "Stability of Performance and Interfacial Problems in GaAs MESFETs," IEEE Trans. Electron Devices, vol. ED-27, No. 6, pp. 1037-1044, Jun. 1980.

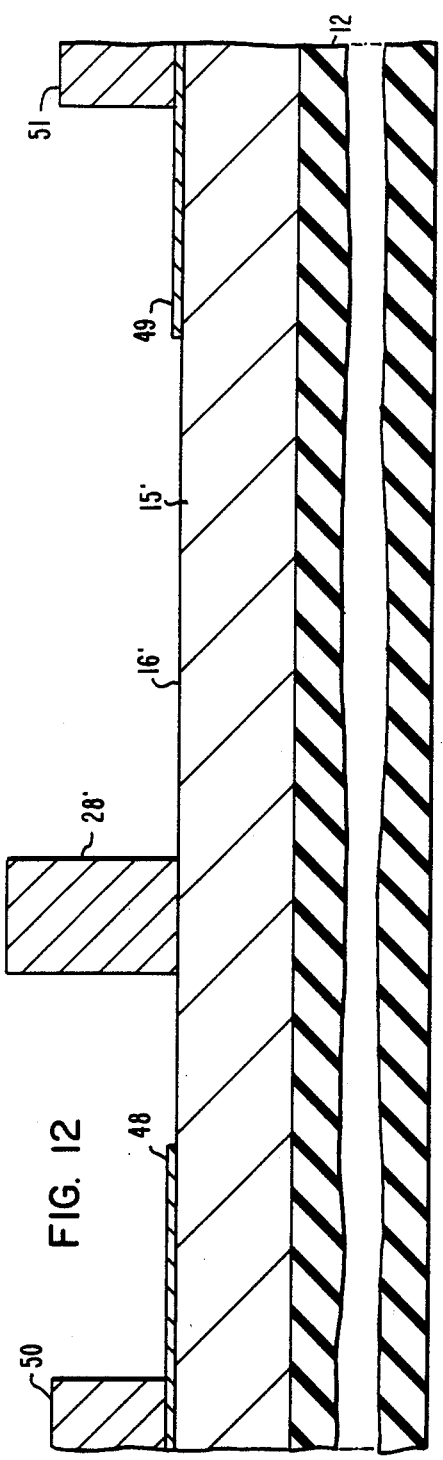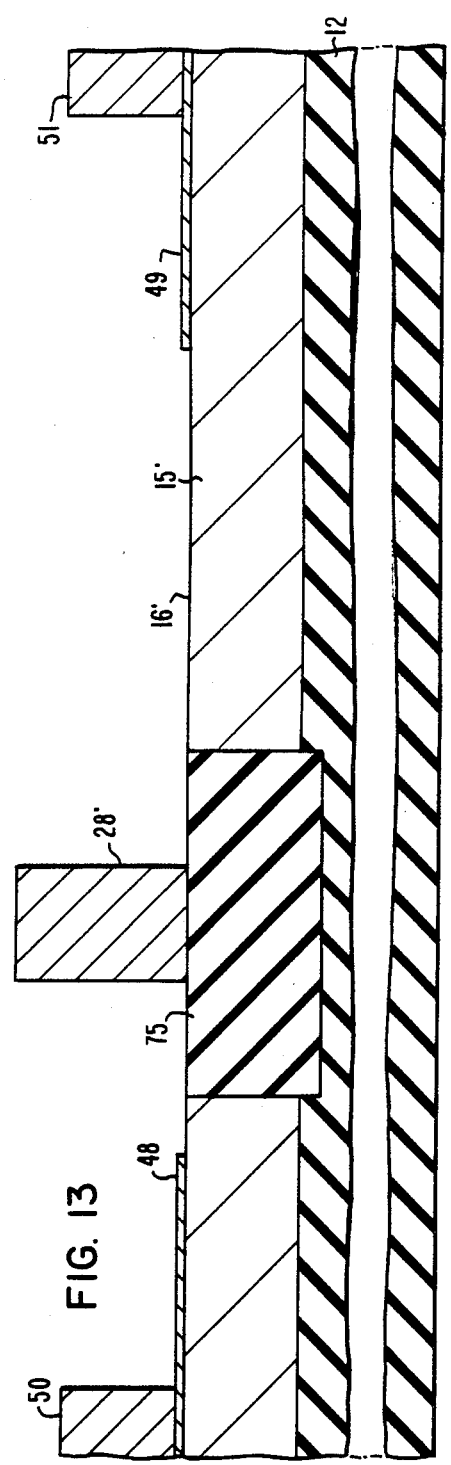

CASTELLATED GATE FIELD EFFECT TRANSISTOR

BACKGROUND OF THE INVENTION

1. Field of the Invention

This invention relates to field effect transistors and more particularly to a metal semiconductor field effect transistor.

2. Description of the Prior Art

In space and airborne electronics, such as a phased-array radar, an overriding requirement is for high power rf or microwave efficiency. Not only can a significant reduction in weight be achieved through reduced input power and heat dissipation requirements, but improved transistor reliability is obtained through efficient, lower temperature operation.

The rf or microwave power and efficiency delivered by a gallium arsenide metal semiconductor field effect transistor (MESFET) may be conveniently predicted from the DC characteristics of the device. If $I_f$ is the maximum channel current in the field effect transistor, $V_K$ is the saturation or knee voltage, and $V_{SD}^L$ is the sustainable source-to-drain voltage at or near pinch-off, then the available output power in watts is given by equation (1).

$$\text{Class A Power Output} = \frac{[V_{SD}^L - V_K]}{8} \times [I_f - I_m] \quad (1)$$

In equation (1), $I_m$ is the leakage current or unmodulated source-to-drain current. The maximum Class A drain efficiency in percent of the field effect transistor is given by equation (2).

$$\eta = \tfrac{1}{2} \frac{I_f - I_m}{I_f + I_m} \times \frac{V_{SD} - V_K}{V_{SD}} \times 100 \quad (2)$$

For the efficiency at maximum power, $V_{SD}$ in equation (2) would equal $V_{SD}^L$ of equation (1). Inspection of equations (1) and (2) shows that a reduction or elimination of $I_m$ and $V_K$ will improve efficiency to a maximum of 50%, and an increase in $V_{SD}^L$ without an increase in leakage current $I_m$ will enhance the output power according to equation (1) in direct proportion to $V_{SD}^L$.

Present technology for gallium arsenide MESFET fabrication provides field effect transistors with DC characteristics typified by substantial source-drain leakage currents and a soft premature breakdown such as discussed in a publication by DiLorenzo, J. V. and Wisseman, W. R., "GaAs Power MESFETs Design Fabrication and Performance," (1979), IEEE Trans. M.T.T. 27, No. 5, p. 367.

The souce-drain leakage currents and soft premature breakdown are accompanied by saturated output power with increased drain voltage and depressed DC-to-rf conversion efficiency as discussed in the publications by Wemple, S. H., Niehaus, W. C., Schlosser, W. O., and Cox, H. M., "Performance of GaAs Power MESFETs," (1978), Electron Lett., Vol. 14, p. 175 and Macksey, H. M., Adams, R. L., McQuiddy, D. N., Jr., Shaw, D. W., and Wisseman, W. R., "Dependence on GaAS MESFET Microwave Performance on Device and Material Parameters," (1977), IEEE Trans. Electron Devices, Vol. ED24, p. 113.

Premature source-drain breakdown has been an important topic in the literature in recent years. Explanations offered for the breakdown mechanism have been numerous. In a publication by Wemple, S. H., Niehaus, W. C., Cox, H. M., DiLorenzo, J. V., and Schlosser, W. O., entitled "Control of Gate to Drain Avalanche in GaAs MESFETs," (1980), and found in IEEE Trans. Electron Devices, No. 6, p. 103, gate to drain avalanche was discussed.

In a publication By Tiwari, W., Eastman, L. F., and Rathburn, L., entitled "Physical and Material Limitations on Burnout Voltage of GaAS Power MESFETs," found in IEEE Trans. Electron Devices, Vol. ED-27, No. 6, June, 1980, p. 1045, buffer layer conduction is described.

In a publication by Furutsuka, T., Tsuji, T., and Hasegawa, F., (1978), found in IEEE Trans. MTT-24, p. 512, dipole accumulation layers are discussed.

In a publication by Fukuta, M., Suyama, K., Suzuki, Y., Nakayama, Y., and Ishikawa, H., entitled "Power GaAs MESFET with a High Drain Source Breakdown Voltage," IEEE Trans. Microwave Theory Tech., Vol. MTT-24, pp. 312–317, June, 1976, field distributions were discussed.

In a publication by Ladbrooke, P., and Martin, A. L., entitled "Material and Structure Factors Affecting the Large Signal Operation of GaAs MESFETs," published in the Int. Conf. on Semi-Insulating GaAs, France, 1980, p. 313, traps in the interface region were discussed.

In a publication By Englemann, R. W. H. and Liechti, C. A., (1976), found in IEEE Trans. Electron Devices, p. 1288, differential negative resistance was discussed.

In a publication by Morizane, K., Dosen, M., and Mori, Y., entitled "A Mechanism of Source-Drain Burnout in GaAs MESFETs," (1979), found in the Inst. Phys. Conf. Ser. No. 45, p. 287, thermal burnout in MESFETs was discussed.

Empirically, power delivery at microwave frequencies has been enhanced by reducing parasitics, through recessing the gate to reduce $V_K$ and increase $I_f$ such as discussed by Englemann et al. cited above and by Hasegawa, F., Takayama, Y., Higashisaka, A., Furutsuka, T., and Honjo, K., in a paper entitled "GaAs Power MESFETs with a Simplified Recess Structure," (1978), found in ISSCC Techn. Dig., pp. 118–119.

In a paper by Fukuta, M., et al. published in (1976) in IEEE Trans. Microwave Theory and Tech., MTT-24:312, microwave frequencies were enhanced by inserting N++ regions at the source and drain contacts to reduce $V_K$ and to modify electric field distributions.

In a publication by Anderson, J. R., Omori, M. and Cooke, F., (1978), IEEE Int. Electron Devices Meeting Dig. Tech. Papers, p. 133, and in a publication by D'Asaro, DiLorenzo, J. V. and Fukuii, H. entitled "Improved GaAs Microwave Field Effect Transistors with Via Connections through the Substrate," (1977), Int. Electron Devices Meeting. Tech. Dig., p. 370, microwave frequencies were enhanced by reducing parasitics through air bridge and via interconnects that reduce source inductance. The above techniques however have had little impact on reducing $I_m$ or increasing $V_{SD}^L$.

In a publication by T. Itoh and H. Yanai entitled "Stability of Performance and Interfacial Problems in GaAS MESFET's" in IEEE Trans. on Electron Devices, Vol. ED-27, No. 6, June, 1980, pp. 1037–1044, interface effects in GaAs MESFET's having a 1 μm gate length with and without a buffer layer were investigated.

In U.S. Pat. No. 4,104,672 which issued on Aug. 1, 1978 to DiLorenzo et al., an integrated high power gallium arsenide field effect transistor device is described having a multi-gate structure. FIG. 4 of U.S. Pat. No. 4,104,672 shows gates 30-36.

It is therefore desirable to provide a MESFET having reduced leakage current at pinch-off by depleting the channel substrate interface to provide a MESFET with higher rf power, efficiency, and frequency response and at the same time a lower noise figure.

It is further desirable to provide a MESFET wherein a plurality of openings across the channel permit the gate electrode over the channel to be on the side walls and bottom of the openings which will confine the electrons in the channel region between the openings and provide a depletion layer beneath the channel.

It is further desirable to provide a MESFET of gallium arsenide material with a Schottky barrier gate with indentations in the channel by the gate to permit the gate electrode to wrap around small cross sections of the channel to confine the electrons interior of the channel and to provide a depletion layer beneath the channel.

It is further desirable to provide a MESFET having a plurality of semi-insulating regions which are spaced apart by a predetermined distance in a path across the channel and wherein each region has a predetermined depth at least through the channel and a layer of conductive material deposited thereover along the path to provide a gate electrode wherein the electrons are confined by a depletion layer between the semi-insulating regions and wherein a depletion layer is formed beneath the channel of the MESFET.

SUMMARY OF THE INVENTION

In accordance with the present invention, a field effect transistor comprising a substrate, a semiconductor layer having an upper surface positioned over the substrate, and a gate electrode on the upper surface traversing the semiconductor layer and passing through a plurality of spaced-apart openings in the semiconductor layer to the substrate to provide a plurality of conductive paths in the semiconductor layer between the openings. The gate electrode forms a Schottky barrier diode with the semiconductor layer and with the substrate which may be a semiconductor having a high resistivity, the depletion region formed by the potential on the gate electrode confines the current in the conductive path within the semiconductor layer and above the substrate as it passes between the openings whereby the leakage current at pinch-off is reduced.

The invention further provides a method of forming a field transistor in a semiconductor layer having an upper surface on a substrate comprising the steps of forming a plurality of spaced-apart openings traversing said semiconductor layer, each opening extending from the upper surface to the substrate, and forming a gate electrode on the upper surface traversing the semiconductor layer and passing through the openings to the substrate to provide a plurality of conductive paths in the semiconductor layer between the openings.

The invention further provides a field effect transistor comprising a substrate, a semiconductor layer over the substrate, and a gate electrode traversing the semiconductor layer, the semiconductor layer having a plurality of semiconductor regions of high resistivity spaced apart and extending from the upper surface to the substrate underneath the gate electrode whereby transistor current is channeled in the semiconductor layer between the semiconductor regions of high resistivity.

The invention further provides a method of forming a field effect transistor in a semiconductor layer on a substrate comprising the steps of forming a plurality of semiconductor regions of high resistivity spaced apart and traversing the semiconductor layer, each region extending from the upper surface to the substrate, and forming a gate electrode on the upper surface traversing the semiconductor layer and positioned over the semiconductor regions of high resistivity whereby transistor current is channeled in the semiconductor layer between the semiconductor regions.

BRIEF DESCRIPTION OF THE DRAWINGS

FIG. 12 is a cross-section view along the lines XII—XII of FIG. 10;

FIG. 13 is a cross-section view along the lines XIII—XIII of FIG. 10;

DESCRIPTION OF THE PREFERRED EMBODIMENT

Figure 1:
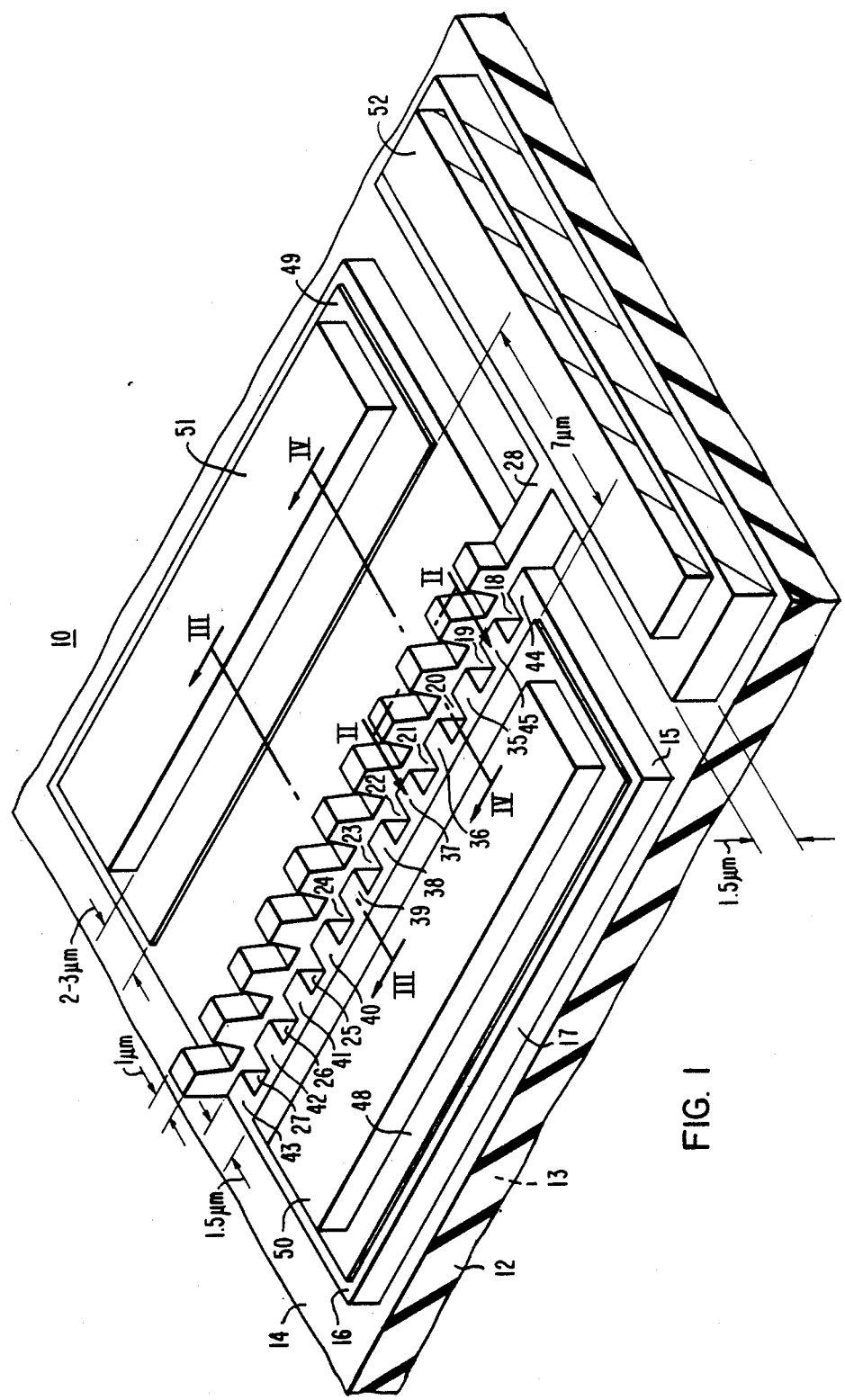
FIG. 1 is one embodiment of the invention.

Referring to the drawings and in particular to FIG. 1, a field effect transistor 10 is shown. A substrate 12 having an upper surface 14 supports a semiconductor layer 15 having an upper surface 16. Substrate 12 may be for example semi-insulating gallium arsenide which may be about 100 micrometers thick. Semiconductor layer 15 may be for example gallium arsenide which may be for example in the range 0.1 to 5 micrometers thick. Layer 15 may be formed by ion implantation such as by implanting silicon to a 1 mircrometer depth which activates the gallium arsenide layer 15 from the original substrate 12. The activated layer 15 may subsequently be etched to form a mesa 17 which is electrically isolated on substrate 12. Semiconductor layer 15 may also be formed by the epitaxial deposition of gallium arsenide wherein a suitable dopant is included during deposition to form an activated layer of gallium arsenide.

Substrate 12 may also be of other semiconductor material such as silicon having a high resistivity or above 100 ohms/cm$^2$. Semiconductor layer 15 may be silicon which may be epitaxially deposited on a silicon substrate of high resistivity and doped at a level suitable for a field effect transistor channel.

At the time mesa 17 is formed, or subsequently, semiconductor layer 15 may have openings 18–27 which may be formed for example by reactive-ion etching using $CF_1Cl_2$ gas and a photoresist pattern to define the openings.

Figure 2:
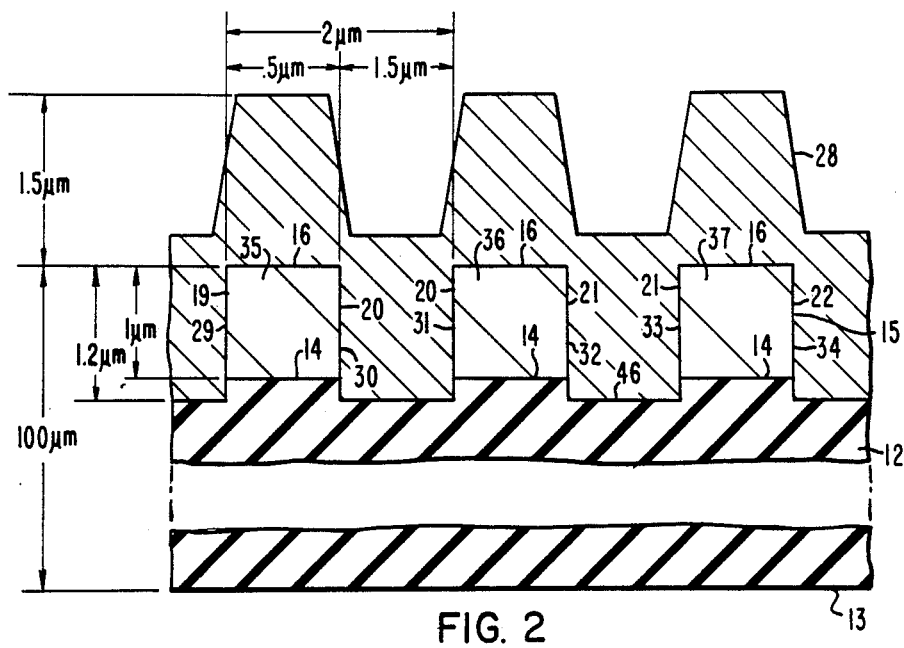
FIG. 2 is a cross-section view along the lines II—II of FIG. 1.
Figure 3:
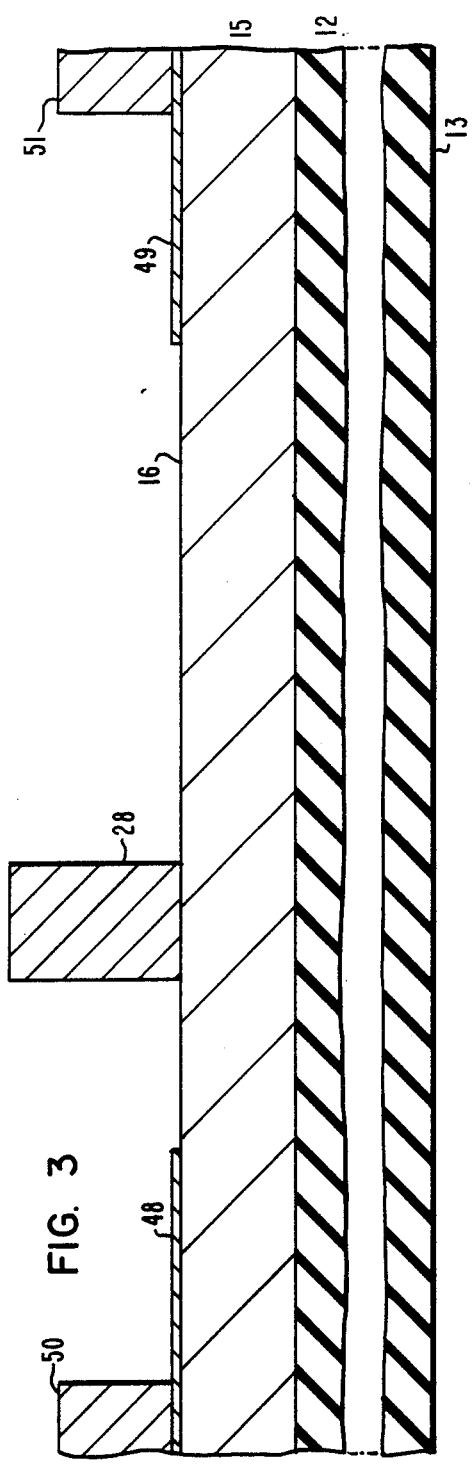
FIG. 3 is a cross-section view along the lines III—III of FIG. 1.
Figure 4:
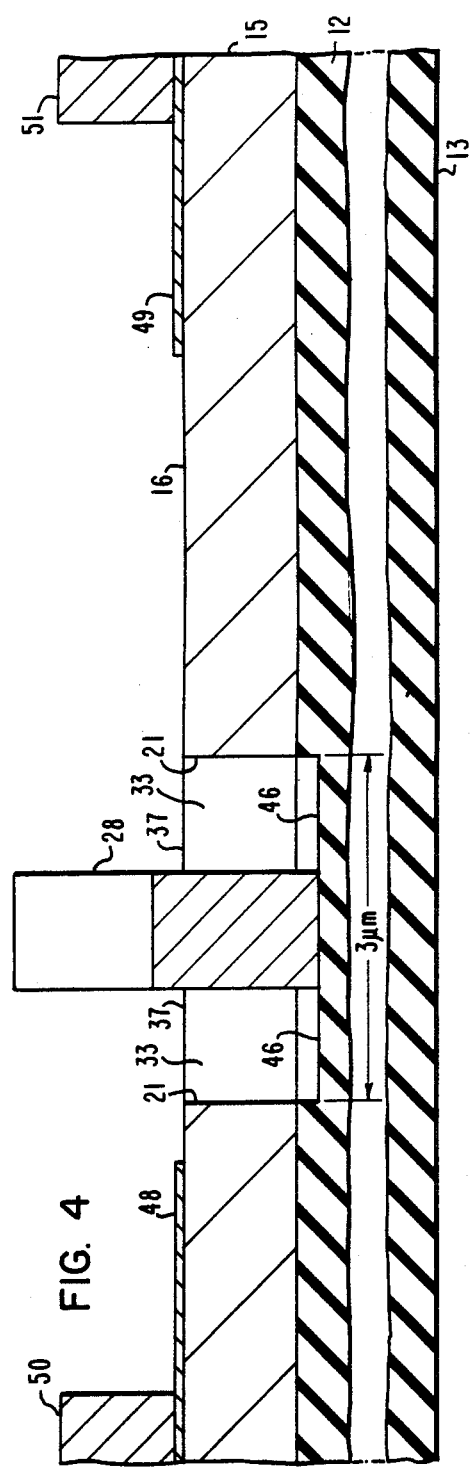
FIG. 4 is a cross-section view along the lines IV—IV of FIG. 1.

FIGS. 2-4 are cross-section views along the respective Roman numeral numbers in FIG. 1 which show openings 18-27 and conducting bars 35-45 more clearly. Openings 18-27 which form conducting bars 35-45 may for example have a width shown in FIG. 2 of 1 micrometer and a length shown in FIG. 4 of 3 micrometers. Openings 18-27 are spaced apart to provide conducting bars 35-45 of a predetermined width. Openings 18-27 may be spaced periodically such as on a period of 2 micrometers and may completely pass through layer 15 into substrate 12 to a predetermined depth such as for example 1.2 micrometers. The side walls of openings 18-27 and/or conducting bars 35-45 may be substantially flat in areas where a gate electrode 28 is subsequently applied.

Referring to FIG. 2, side walls 29 and 30 in openings 19 and 20, respectively, are side walls of conducting bar 35 of semiconductor material of layer 15. Side walls 31 and 32 of openings 20 and 21, respectively, are side walls of conducting bar 36 of semiconducting material of layer 15. Side walls 33 and 34 of openings 21 and 22, respectively, are side walls of conducting a bar 37 of semiconductor material of layer 15.

While FIGS. 1 and 4 show openings 18-27 having a length of about 3 micrometers, openings 18-27 may be extended towards and underneath the source and towards and underneath the drain, resulting in long side walls 29-34 and thus long conducting bars 34-45 between the source and drain and electrodes 48 and 49 shown in FIG. 1. The elongated openings 18-27 would therefore take the shape of grooves which could extend to or beyond underneath the source and drain electrodes.

A source electrode 48 and drain electrode 49 may be formed on semiconductor layer 15 and having a predetermined spacing such as 7 micrometers from one another and positioned transverse to the semiconductor conducting bars. Source electrode 48 and drain electrode 49 may be for example 2000 Angstroms thick which may be formed by first depositing a layer of photoresist over layer 15 which is subsequently defined to expose the desired areas for source electrode 48 and drain electrode 49. Source electrode 48 and drain electrode 49 may be formed by evaporating gold, germanium, nickel, and platinum which may be alloyed into semiconductor layer 15 at 460° C. where semiconductor layer 15 is gallium arsenide. Previous to alloying, the photoresist was dissolved to lift off the undesired evaporated metal in areas outside the source and drain electrode.

Another layer of photoresist was applied about 2 micrometers thick over layer 15. A strip of photoresist was developed to provide an opening 1 micron long in the direction of conducting bars 35-45 and traversing the mesa 17 across conducting bars 35-45 shown in FIG. 1. The opening in the photoresist would provide the future site of gate electrode 28. First, however, while monitoring the source-drain current between source electrode 48 and drain electrode 49, the conducting bars such as 35-45 were etch recessed to give a current through the bars of a predetermined value such as 250 milliamps per millimeter. Aluminum was subsequently deposited over the exposed conducting bars 35-45 to provide a self-aligned gate electrode which coated conducting bars 35-45 and provided a continuous metal stripe across mesa 17 over conducting bars 35-45. To insure continuous metal over the openings 18-27, the aluminum was deposited to 1.5 micrometers thick. The photoresist was developed and lifted off which removed the other aluminum outside the desired gate electrode 28 area.

Another layer of photoresist was formed over layer 15 and removed in selected areas. A layer of thick metal 1 micrometer thick for example such as titanium, platinum, and gold, was deposited over source electrode 48, drain electrode 49, and gate electrode 28 to form a source pad 50, drain pad 51, and gate pad 52 for bonding interconnection wires thereto.

As shown in FIG. 1, field effect transistor 10 has a gate length of 1 micrometer, a gate recess of 2000 Angstroms into conducting bars 35-45, a drain-source spacing of 7 micrometers, a source-gate spacing of 1.5 micrometers, and 11 conducting bars. The 11 conducting bars 35-45 provide a plurality of conductive paths for the current between the drain and source. Each conducting bar may be 1 micrometer in height and 0.5 micrometers in width (transverse to the current flow). The spacing between conducting bars 35-45 may for example be 1.5 micrometers. It is understood that while these dimensions are shown in FIG. 2, the cross-section view in FIG. 2 is not drawn to scale. The castellated gate periodically touches substrate 12 in a period of for example 2 micrometers and the castellated gate wraps around each conducting bar on at least three sides.

The channel current $I_c$ for a single conducting bar castellation is given by equation (3):

$$I_c = v_s q N A B \quad (3)$$

A gate recess depth greater than zero bias depletion depth is assumed. In equation (3), $v_s$ is the saturated electron velocity, q is the electronic charge, N the doping, A the castellation depth, and B the castellation width.

Equation (3) may be reduced to equation (4):

$$I = \frac{0.224\ NAB}{p} Z \text{ (Amps) for a complete device,} \quad (4)$$

In equation (4) Z (in millimeters) is the source periphery and p (in millimeters) is the castellation period.

As voltage $(-V_g)$ is applied to the gate, the depletion layer depth $(x\mu m)$ increases in the channel according to equation (5):

$$V_g = \frac{qNx^2}{2\epsilon_0\epsilon_r} \ (V) \quad (5)$$

which reduces to equation (6):

$$V_g = 7.23 N x^2 (V) \quad (6)$$

for $\epsilon_0\epsilon_r = 12.9 \times 8.84 \times 10^{-4}$ f/cm, $g = 1.602 \times 10^{-19}$, N is in units of $10^{16}$ cm$^{-3}$, and x is in $\mu$m.

Therefore, by combining equations (4) and (6), the transfer characteristic is given by equation (7):

$$I = (B - 2x)(A - x)0.224 Nz/p(A) \quad (7)$$

An approximation for the gate-to-source capacitance is given by equation (8):

$$C_{sg} = L_g \frac{(B-x) + 2(A-x)\epsilon_o\epsilon_r}{x} \frac{Z}{P} + C_{res} \qquad (8)$$

where $C_{sg}$ is the source-to-gate capacitance, $L_g$ is the gate length, and $C_{res}$ is the residual capacitance in the FET at pinch-off. $C_{res}$ comprises fringe capacitances of the depleted channel and parasitic gate source capacitance.

Figure 5:
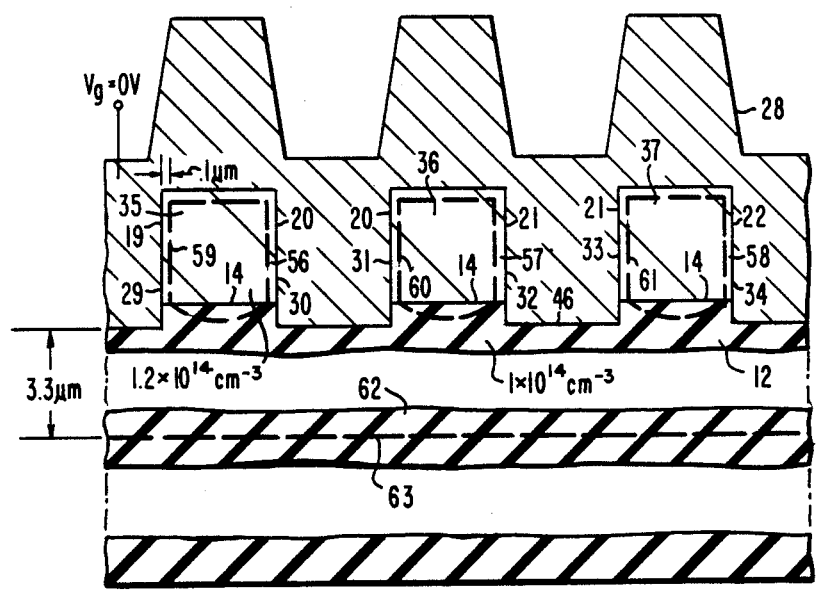
FIGS. 5–9 are cross-section views along the lines III—III of FIG. 1 showing the depletion region as a function of gate voltage.

FIGS. 5-9 are cross-section views along the lines II—II of FIG. 1 showing the depletion region as a function of gate voltage around conducting bars 35-37. In FIGS. 5-9, conducting bars 35-37 are assumed to have a doping level of $1.2 \times 10^{17}$ atoms/cm$^3$ to form n type gallium arsenide material. The substrate 12 of gallium aresenide material is considered to be semi-insulating having a doping level of $1 \times 10^{14}$ atoms/cm$^3$. Electrode 28 is assumed to be aluminum which will form a Schottky barrier diode with conducting bars 35-37, layer 15, and substrate 12. In FIG. 5, a gate potential $V_g$ of zero volts is applied. Depletion regions 56-58 will form around conducting bars 35-37, respectively, as shown by dash line curves 59-61, respectively. It is estimated that depletion regions 56-58 will be approximately 0.1 micrometers thick from the outside surface on three sides of conducting bars 35-37 as shown in FIG. 5. Gate electrode 28 will also form a Schottky barrier diode with respect to substrate 12 causing a depletion region 62 below conducting bars 35-37 and extending 3.3 micrometers into substrate 12 below the interface of gate electrode 28 and substrate 12. Dash line 63 shows the lower edge of depletion region 62. The portion of dash line 59-61 in substrate 12 shows the upper edge of depletion region 62.

Figure 6:
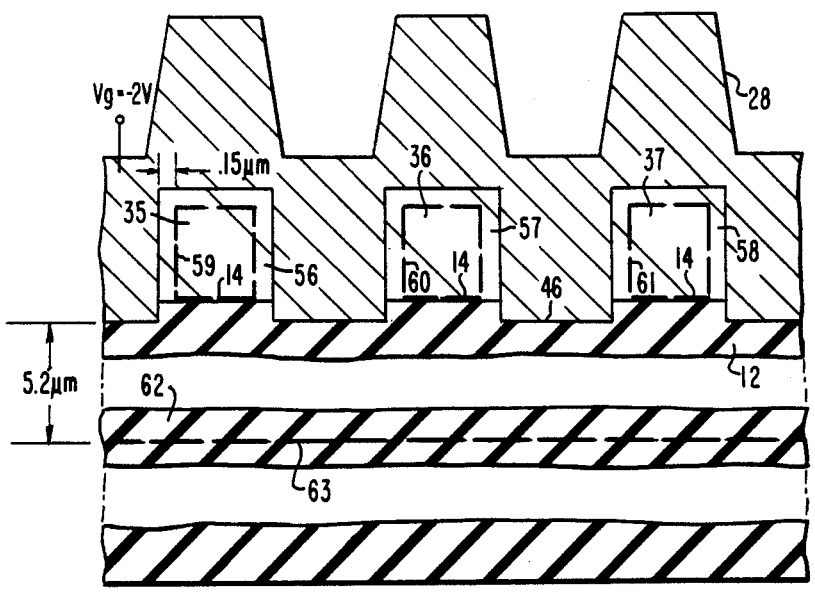

Referring to FIG. 6, the edge of the depletion regions 56-58 are shown by curves 59-61 which extend inward from the outside surface on three sides of conducting bars 35-37, respectively, by 0.15 micrometers. The potential on gate electrode 28 is $-2$ volts. Depletion region 62 in substrate 12 is driven further away from gate electrode 28, causing dash line 63 to be at a distance of 5.2 micrometers from the interface of gate electrode 28 and substrate 12. As can be seen in FIG. 6, the depletion region surrounding conducting bars 35-37 has increased, limiting the conducting area of conducting bars 35-37 for carrying current.

Figure 7:
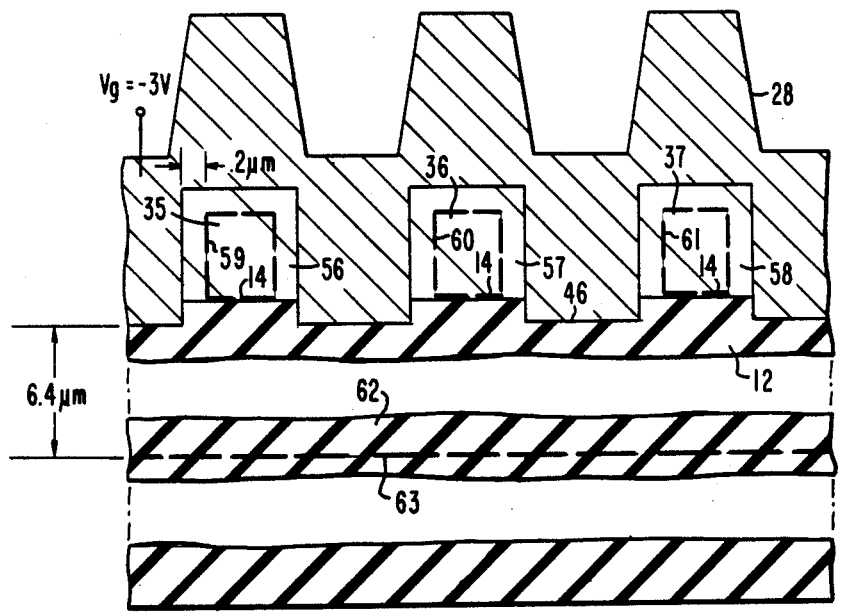

Referring to FIG. 7, depletion regions 56-58 and 62 are shown for a gate voltage $V_g$ of $-3$ volts. The depletion region around three sides of conducting bars 35-37 has increased to approximately 0.2 micrometers. The conducting area circumscribed by dash line curves 59-61 has been reduced relative to FIG. 6. The lower depletion edge shown by dash line 63 for depletion region 62 is shown as 6.4 micrometers from the interface of gate electrode 28 and substrate 12. The upper edge of depletion region 62 is along the interface of conducting bars 35-37 and substrate 12 which is that portion of curves 59-61 along upper surface 14 of substrate 12.

Figure 8:
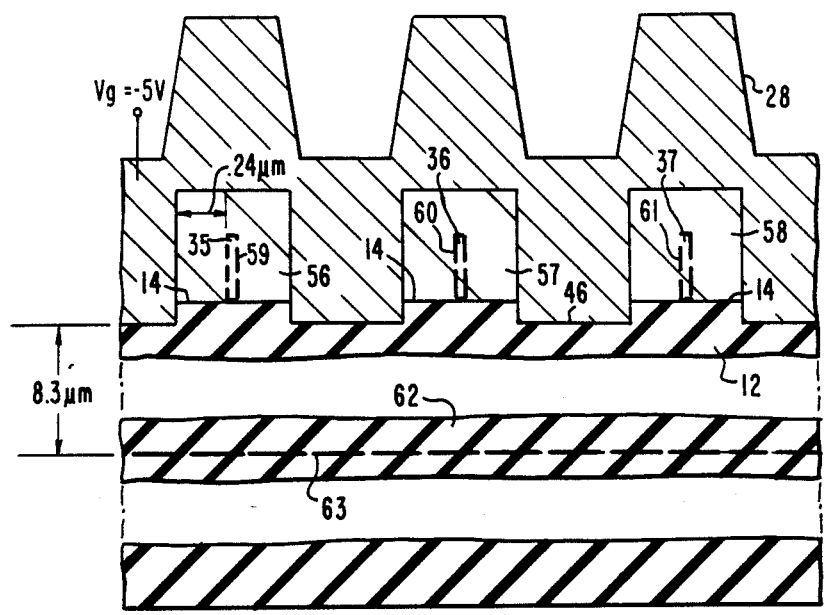

FIG. 8 shows the depletion regions 56-58 and 62 at times when the gate voltage $V_g$ is $-5$ volts. The depletion region extends from the three sides of conducting bars 35-37 into the bars by approximately 0.24 micrometers. As can be seen, the conducting bars 35-37 have a very small cross-section for conducting transistor current and are approaching pinch-off condition where no current will flow. The conducting cross section is circumscribed by curves 59-61 which show the edge of the depletion regions 56-58. The lower depletion region in substrate 12 has a lower edge 63 which is 8.3 micrometers from the interface of gate electrode 28 and substrate 12. The upper edge of depletion region 62 is along the upper surface of substrate 12 along curves 59-61.

Figure 9:
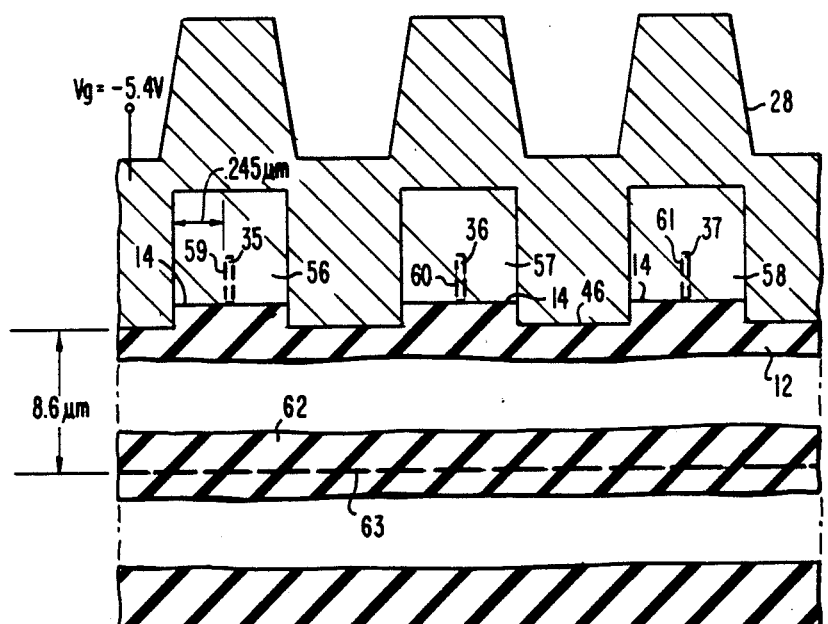

FIG. 9 shows the depletion regions 56-58 and 62 for the case where the gate voltage $V_g$ is $-5.4$ volts. The depletion regions 56-58 extend into conducting bars 35-37 from three sides by about 0.245 micrometers. The conducting regions of conducting bars 35-37 are interior of curves 59-61 which show the edge of depletion regions 56-58. Depletion region 62 and substrate 12 have an upper edge at upper surface 14 along curves 59-61 and a lower edge along dash line 63 which is 8.6 micrometers from the interface of gate electrode 28 and substrate 12.

As can be seen in FIG. 9, transistor 10 is very close to pinch-off condition when no current will flow. Also as can be seen, the current is confined within conducting bars 35-37 and no leakage current will flow in the proximity of upper surface 14 since upper surface 14 is isolated by depletion region 62. The only leakage current that may flow is between dash line 63 and lower surface 13 of substrate 12. As can be seen in FIG. 9, in order to pinch-off the current in conducting bars 35-37, the depletion region must extend from three sides into conducting bars 35-37. Thus, conducting bars which have side walls spaced further apart from each other will require a larger gate voltage to drive the depletion region further into the conducting bars 35-37 to achieve pinch-off. Further as can be seen in FIG. 9, the depletion region completely surrounds the conducting region of conducting bars 35-37, thereby isolating and shielding the conducting region from sources of leakage current and from back gating effects.

Figure 10:
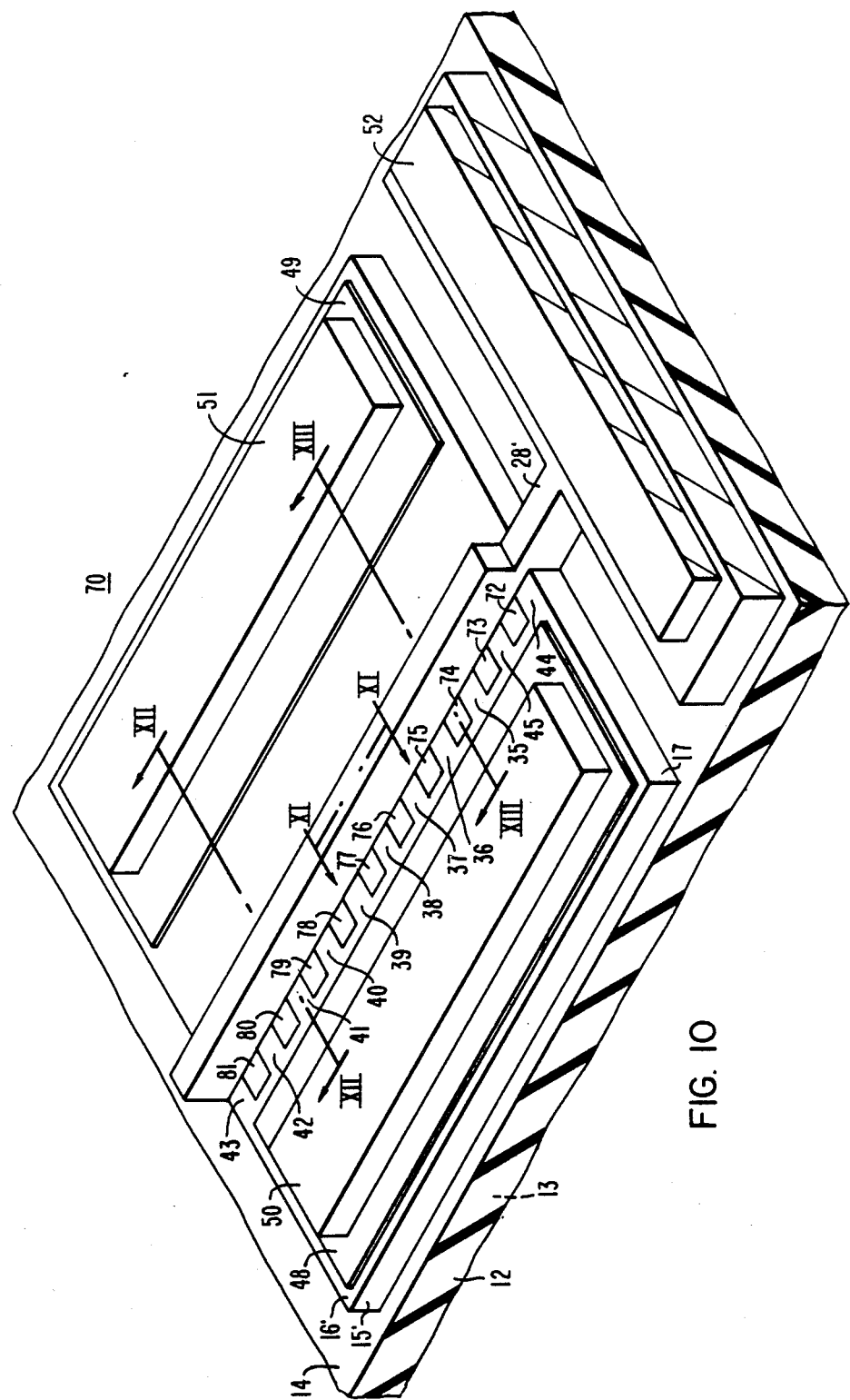
FIG. 10 is an alternate embodiment of the invention.

Referring to FIG. 10, a field effect transistor 70 is shown. In FIG. 10, like references are used for functions corresponding to the apparatus of FIG. 1.

In place of openings 18-27 formed in fabrication of transistor 10 in FIG. 1, insulating regions 72-81 may be formed in and through semiconductor layer 15'. Regions 72-81 may be rectangular in shape and have a predetermined depth. Insulating regions 72-81 may be formed by defining a masking material on upper surface 16' over the desired location of insulating regions 72-81. Layer 15' may then be formed by ion implanting silicon into substrate 12 to a depth of for example 1 micrometer which will activate the layer to form semiconductor layer 15'. Insulating regions 72-81 will not be exposed to the ion implantation and thus regions 72-81 will remain the same as substrate 12 and be semi-insulating for the case where substrate 12 is gallium arsenide. Gate electrode 28' may thus be deposited and defined to traverse mesa 17 over insulating regions 72-81.

Alternatively, semiconductor layer 15' may be deposited epitaxially and doped at the time of formation to form n type conductivity material. Regions 72-81 may be formed by proton irradiation through a mask having openings above the desired location of regions 72-81 to permit protons to enter into layer 15' to convert the N doped material back to semi-insulating material. The depth of proton damage may be controlled to provide a predetermined depth such as 1-2 microns. After the mask is removed, the aluminum gate 28' may be deposited over regions 72-81 and traversing mesa 17 to form the gate electrode of transistor 70.

Figure 11:
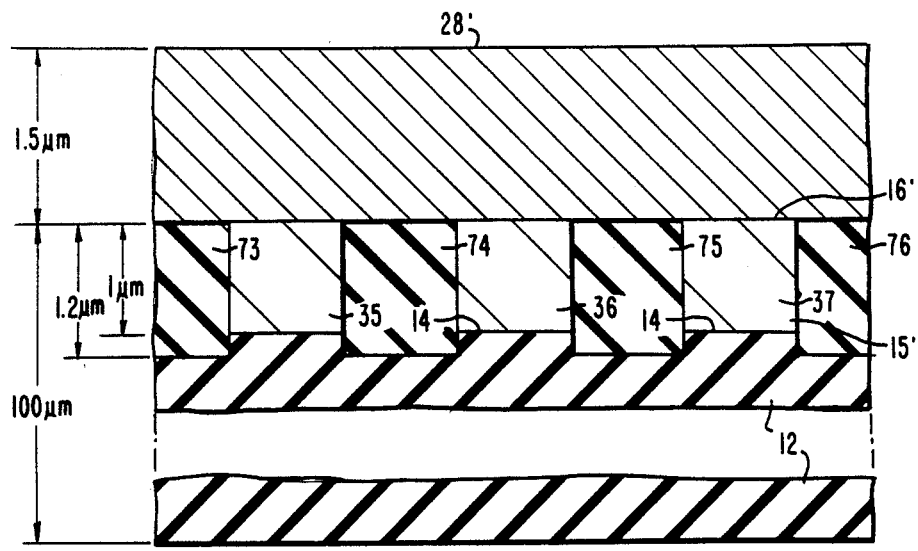
FIG. 11 is a cross-section view along the lines XI—XI of FIG. 10.

FIG. 11 is a cross-section view along the lines XI—XI of FIG. 10. As shown in FIG. 11, gate electrode 28' passes over insulating regions 73-76 and conducting bars 35-37 smoothly along upper surface 16' of layer 15'. The problem of continuous metal formation over the corners of the conducting bars in and out of openings is thus avoided.

FIG. 12 is a cross-section view along the lines XII—XII of FIG. 10 and FIG. 13 is a cross-section view along the lines XIII—XIII of FIG. 10. In FIG. 13 region 75 is shown with gate electrode 28' above. Electrode 28' forms a Schottky barrier diode with insulating regions 72-81 and forms a Schottky barrier diode with conducting bars 35-37. At times when a voltage is placed on conductor 28', such as −6 volts, a depletion region will extend through insulating regions 72-81 and beyond into substrate 12 underneath conducting bars 35-45 therefore isolating conducting bars 35-45 from substrate 12. A depletion region will extend from electrode 28' into conducting bars 35-45 from upper surface 16'.

A field effect transistor 10 of the embodiment of FIG. 1 was fabricated having a gate length of 1 micrometer, a gate recess of 2000 Angstroms, a drain-source spacing of 7 micrometers, a source-gate spacing of 1.5 micrometers and individual conducting bars each 0.65 micrometers across on a 2 micrometer period with a total of 600 castellations or conducting bars in parallel. The source periphery is 1200 micrometers.

Figure 14:
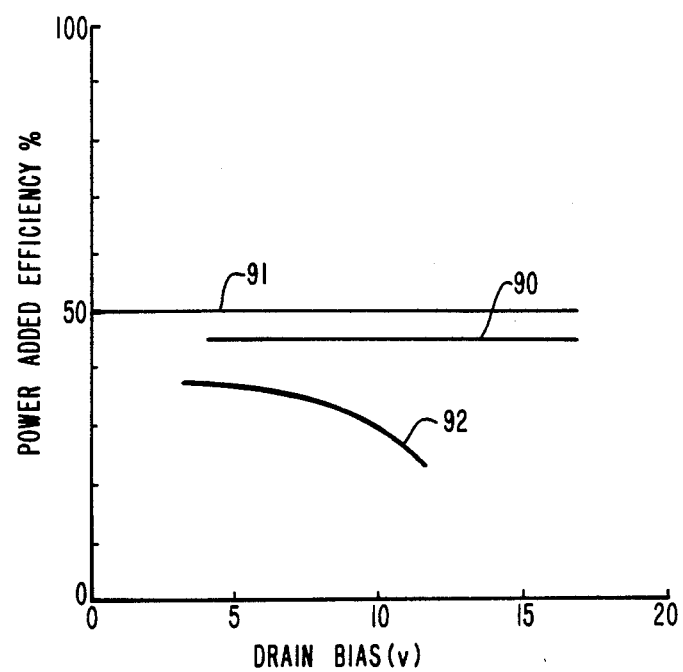
FIG. 14 is a graph showing the power added efficiency versus drain bias of the embodiment of FIG. 1.

FIG. 14 is a graph showing the power added efficiency versus drain bias of the embodiment of FIG. 1. In FIG. 14, the ordinate represents power added efficiency in percent and the abscissa represents drain bias in volts. Curve 90 shows the power added efficiency of the castellated field effect transistor (CFET) at 4 GHz of 45% from 5 to 17 volts drain bias. Curve 91 shows the maximum theoretical Class A$v$ power-added efficiency value of 50%. Curve 92 shows the measured power added efficiency of a MESFET without castellation but otherwise similar and made by the Westinghouse Electric Corporation using state-of-the-art technology. Curve 92 shows 35% maximum power added efficiency at 4 GHz, degrading rapidly with drain bias reaching 25% at a drain bias of 10 volts.

Figure 15:
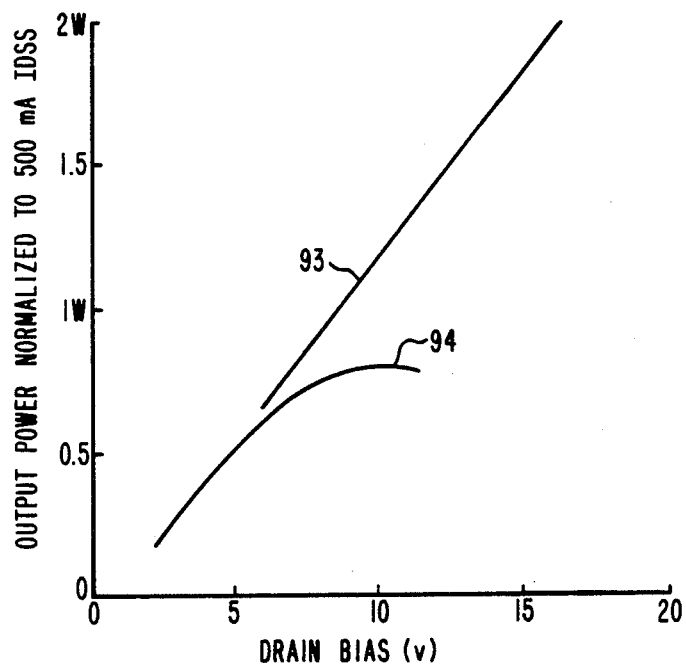
FIG. 15 is a graph showing the output power versus drain bias of the embodiment of FIG. 1.

FIG. 15 is a graph showing the output power versus drain bias of the embodiment of FIG. 1. In FIG. 15 the ordinate represents rf output power at 4 GHz and the abscissa represents drain bias in volts. Curve 93 shows the rf output power at 4 GHz of the castellated field effect transistor (CFET) with a drain bias from 6 to 17 volts. The output power increases with drain bias. Curve 94 shows the rf output power at 4 GHz of a MESFET without castellations but otherwise similar, referred to with respect to curve 92 in FIG. 14. Curve 94 shows output power saturation as the drain bias increases and with further increases, the output power decreases. The reduction in output power shown by curve 94 in FIG. 15 and the reduction in power-added efficiency shown by curve 92 in FIG. 14 with increase drain bias in the MESFET without castellations are indicators of an inhibited current swing in the device due to substrate leakage currents.

A method and apparatus has been described for a new field effect transistor wherein the gate electrode is castellated or allowed to pass through the semiconductor layer forming the transistor channel wherein the conducting channel is divided into a plurality of conductors with a depletion region wrapped around each conducting path.

In one embodiment, the castellations are formed by openings in the semiconductor layer, permitting the gate electrode to form a Schottky barrier diode with the substrte of semi-insulating material and a Schottky barrier diode with the semiconductor layer conducting the current.

In an alternate embodiment, semi-insulating regions are formed in the layer in place of openings and the gate electrode is deposited across both insulating regions and the conducting bars therebetween to provide a depletion region through the insulating regions into the semi-insulating substrate below the channel. The invention permits the insulating regions to be formed by masking a semiconductor layer prior to activation by ion implanting silicon for example into gallium arsenide. Alternately, a layer of gallium arsenide may be activated by ion implantation with subsequent proton implantation in selected regions to damage the material and convert the material back to semi-insulating semiconductor material. The proton damage in selected regions may be defined by a mask deposited over the semiconductor layer.

I claim:

1. A field effect transistor comprising:
a substrate,
a semiconductor layer having an upper surface over said substrate, and
a gate electrode on said upper surface traversing said semiconductor layer, said semiconductor layer having a plurality of semiconductor regions of high resistivity spaced apart and extending from said upper surface to said substrate underneath said gate electrode whereby transistor current is channeled in said semiconductor layer between said semiconductor regions.

2. The field effect transistor of claim 1 wherein said substrate is semi-insulating gallium arsenide.

3. The field effect transistor of claim 1 wherein said semiconductor layer is n conductivity type gallium arsenide.

4. The field effect transistor of claim 1 wherein said gate electrode includes aluminum.

5. The field effect transistor of claim 1 wherein said substrate is silicon having a resistivity greater than 100 ohms/cm.

6. The field effect transistor of claim 5 wherein said semiconductor layer is n conductivity type silicon.

7. The field effect transistor of claim 1 wherein said gate electrode includes metallic elements to form a Schottky barrier diode with both said semiconductor layer and said semiconductor regions.

8. The field effect transistor of claim 1 wherein said gate electrode is 1 micrometer long in the direction of channel current.

9. The field effect transistor of claim 1 wherein said semiconductor regions pass through said semiconductor layer every 8 micrometers or less.

10. The field effect transistor of claim 1 wherein said semiconductor regions have side walls therebetween channeling transistor currents that are substantially parallel to one another.

11. The field effect transistor of claim 1 wherein said semiconductor regions have a resistivity greater than 100 ohms/cm.

12. The field effect transistor of claim 1, wherein said plurality of spaced-apart high resistivity semiconductor regions extend along the direction of transistor current flow, with the dimension of the said semiconductor region in the direction of transistor current flow exceeding the width of the semiconductor region traverse to the direction of transistor current flow, and which plurality of spaced-apart high resistivity semiconductor regions define therebetween a plurality of semiconductor layer conducting channel portions through which the transistor current is channeled.

13. The field effect transistor of claim 12, wherein the plurality of semiconductor layer conducting channel portions have a rectangular cross-section.

14. The field effect transistor of claim 1, wherein a drain and source electrode are disposed on the upper surface of the semiconductor layer, spaced from and on opposed sides of the gate electrode.

15. A field effect transistor comprising;
 (a) a semi-insulating semiconductive substrate;
 (b) an activated semiconductor layer disposed upon the semi-insulating semiconductor substrate, which activated semiconductive layer has an upper surface spaced above said substrate;
 (c) a plurality of aligned semi-insulating semiconductive regions spaced apart within the activated semiconductor layer and extending therethrough from said upper surface to said substrate;
 (d) spaced apart source and drain electrodes disposed upon the upper surface of the activated semiconductor layer on opposed sides of the aligned semi-insulating semiconductor region; and
 (e) a gate electrode disposed atop the upper surface of the activated semiconductor layer over the aligned semi-insulating semiconductive regions and in electrical contact with the activated semiconductive layer whereby transistor current is channeled in the activated semiconductor channels defined between the spaced-apart aligned semi-insulating semiconductive regions.

* * * * *